(12) United States Patent
Kim et al.

(10) Patent No.: US 10,686,154 B2
(45) Date of Patent: Jun. 16, 2020

(54) DISPLAY SUBSTRATE AND DISPLAY APPARATUS HAVING THE DISPLAY SUBSTRATE

(71) Applicant: Samsung Display Co., LTD., Yongin-si, Gyeonggi-Do (KR)

(72) Inventors: Jihye Kim, Hwaseong-si (KR); Ahyoung Son, Seoul (KR); Byungsun Kim, Suwon-si (KR)

(73) Assignee: Samsung Display Co., Ltd. (KR)

(*) Notice: Subject to any disclaimer, the term of this patent is extended or adjusted under 35 U.S.C. 154(b) by 29 days.

(21) Appl. No.: 15/870,284

(22) Filed: Jan. 12, 2018

(65) Prior Publication Data

US 2018/0219171 A1 Aug. 2, 2018

(30) Foreign Application Priority Data

Jan. 31, 2017 (KR) .................. 10-2017-0014068

(51) Int. Cl.
*H01L 51/52* (2006.01)
*H01L 27/32* (2006.01)

(52) U.S. Cl.
CPC ...... *H01L 51/5203* (2013.01); *H01L 27/3232* (2013.01); *G09G 2310/0272* (2013.01); *H01L 27/3246* (2013.01)

(58) Field of Classification Search
CPC ............ H01L 51/5271; H01L 51/5203; H01L 27/3232; H01L 27/326; H01L 27/3244; H01L 27/322; H01L 27/3213; H01L 27/3246; H01L 51/137; G09F 9/35; G09F 9/33; G02F 1/133553; G02F 1/137; G02F 1/1362; G02F 1/167; G02F 1/1676; G02F 2001/1678; G02F 2201/52; G02F 2201/12; G02F 2203/02; G09G 2310/0272
See application file for complete search history.

(56) References Cited

U.S. PATENT DOCUMENTS

| 9,304,333 B2* | 4/2016 | Taheri .................. G02B 27/281 |
| 2018/0004047 A1* | 1/2018 | Yamazaki ......... G02F 1/133345 |
| 2018/0151640 A1* | 5/2018 | Shim .................. H01L 51/5271 |

FOREIGN PATENT DOCUMENTS

| KR | 10-2014-0041116 A | 4/2014 |
| KR | 10-2016-0104883 A | 9/2016 |

* cited by examiner

*Primary Examiner* — Christopher E Leiby
(74) *Attorney, Agent, or Firm* — Innovation Counsel LLP

(57) ABSTRACT

A display substrate includes an organic light emitting diode disposed in a light-emitting area on a base substrate, a reflection electrode disposed in a reflection area on the base substrate, a transparent electrode disposed on the reflection electrode, and a reflection control layer disposed between the reflection electrode and the transparent electrode, and configured to control a reflectivity based on driving signals applied to the reflection electrode and the transparent electrode.

20 Claims, 14 Drawing Sheets

<RCM OFF>

<RCM ON>

DISPLAY SUBSTRATE AND DISPLAY APPARATUS HAVING THE DISPLAY SUBSTRATE

This application claims priority from and the benefit of Korean Patent Application No. 10-2017-0014068 filed on Jan. 31, 2017, which is hereby incorporated by reference for all purposes as if fully set forth herein.

BACKGROUND OF THE INVENTION

1. Field of the Invention

Exemplary embodiments of the inventive concept relate to a display substrate and a display apparatus having the display substrate. More particularly, exemplary embodiments of the inventive concept relate to a display substrate for decreasing a thickness and a display apparatus having the display substrate.

2. Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting display (OLED) device. Compared to the LCD device, the OLED device has many advantages such as a higher luminance and a wider viewing angle. In addition, the OLED device can be made thinner because the OLED device does not require a backlight. In the OLED device, electrons and holes are injected into an organic thin layer through a cathode and an anode, and then recombined in the organic thin layer to generate excitons, thereby a light of a certain wavelength can be emitted.

Recently, a transparent display device capable of transmitting an image of an object or target that is located in the rear or at the back of the display device by including a transparent region and a pixel region has been developed.

BRIEF SUMMARY OF THE INVENTION

Exemplary embodiments of the inventive concept provide a display substrate having a layer-structure for decreasing a size.

Exemplary embodiments of the inventive concept provide a display apparatus having the display substrate.

According to an exemplary embodiment of the inventive concept, there is provided a display substrate. The display substrate includes an organic light emitting diode disposed in a light-emitting area on a base substrate, a reflection electrode disposed in a reflection area on the base substrate, a transparent electrode disposed on the reflection electrode, and a reflection control layer disposed between the reflection electrode and the transparent electrode, and configured to control a reflectivity based on driving signals applied to the reflection electrode and the transparent electrode.

In an exemplary embodiment, the display substrate may further include a pixel circuit part disposed under the reflection electrode in the reflection area configured to drive the organic light emitting diode.

In an exemplary embodiment, the display substrate may further include an encapsulation layer disposed on the organic light emitting diode in the light-emitting area and the reflection area, wherein the reflection electrode is disposed on the encapsulation layer.

In an exemplary embodiment, the display substrate may further include a planarization layer comprising a via-hole through which a first electrode of the organic light emitting diode is connected to the pixel circuit part, and a pixel defining layer comprising a first opening formed in the light-emitting area corresponding to the first electrode of the organic light emitting diode and a second opening formed in the reflection area.

In an exemplary embodiment, the pixel defining layer may include a light shielding material.

In an exemplary embodiment, a light-emitting layer and a second electrode of the organic light emitting diode may be stacked in the first opening of the light-emitting area, and the second electrode of the organic light emitting diode is disposed in the second opening of the reflection area.

In an exemplary embodiment, a light-emitting layer and a second electrode of the organic light emitting diode may be stacked in the first opening of the light-emitting area and the second opening of the reflection area, respectively.

According to an exemplary embodiment of the inventive concept, there is provided a display apparatus. The display apparatus includes a display panel comprising a display area in which a plurality of pixels is arranged and a peripheral area surrounding the display area, each of the plurality of pixels comprising a light-emitting area in which an organic light emitting diode is disposed and a reflection area in which a reflection electrode, a transparent electrode and a reflection control layer between the reflection electrode and the transparent electrode are disposed, and a data driver circuit configured output a data signal to drive the organic light emitting diode and driving signals to drive the reflection electrode and the transparent electrode based on an intensity of an incident light.

In an exemplary embodiment, the display panel may further include a pixel circuit part disposed under the reflection electrode configured to drive the organic light emitting diode.

In an exemplary embodiment, the display panel may further include an encapsulation layer disposed in the light-emitting area in which the organic light emitting diode is disposed and the reflection area, wherein the reflection electrode is disposed on the encapsulation layer in the reflection area.

In an exemplary embodiment, the display panel may further include a planarization layer comprising a via-hole through which a first electrode of the organic light emitting diode is connected to the pixel circuit part, and a pixel defining layer comprising a first opening formed on the light-emitting area corresponding to the first electrode of the organic light emitting diode and a second opening formed on the reflection area.

In an exemplary embodiment, a light-emitting layer and a second electrode of the organic light emitting diode may be stacked in the first opening of the light-emitting area and at least one of the light-emitting layer and the second electrode of the organic light emitting diode is disposed in the second opening of the reflection area.

In an exemplary embodiment, the pixel defining layer may include a light shielding material.

In an exemplary embodiment, the reflection control layer and the transparent electrode are selectively disposed in a partial area of the display area.

In an exemplary embodiment, when the intensity of the incident light is normal, the data driver circuit is configured to provide the reflection electrode and the transparent electrode with a first driving signal and a second driving signal equal to the first driving signal, respectively, and when the intensity of the incident light is abnormal, the data driver circuit is configured to provide the reflection electrode and the transparent electrode with a first driving signal and a second driving signal different from the first driving signal, respectively.

In an exemplary embodiment, the data driver circuit may include a data driving part configured to output the data signal, a light-sensing part configured to sense the incident light and output a sensing signal, and a control output part configured to output the first and second driving signals based on the sensing signal.

In an exemplary embodiment, the data driver circuit may be disposed in the peripheral area of the display panel.

In an exemplary embodiment, the data driver circuit may be disposed on a flexible circuit board, wherein an end portion of the flexible circuit board may be disposed on the peripheral area of the display panel.

In an exemplary embodiment, the display panel may further include a plurality of light-sensing elements arranged in the peripheral area and configured to sense a light to output a sensing signal.

In an exemplary embodiment, the data driver circuit comprises a data driving part configured to output the data signal and a control output part configured to output the first and second driving signals based on the sensing signal.

According to the inventive concept, the reflection electrode for the mirror may be used as the driving electrode of the reflection control member and thus, a thickness of the display apparatus may decrease. The data circuit part outputting the data signal applied to the pixel and the sensor circuit part outputting the driving signals applied to the reflection control member may be formed as single chip using a TSV (Through Silicon Via) technology and thus a thickness of the data driver circuit may decrease.

BRIEF DESCRIPTION OF THE DRAWINGS

The above and other features and advantages of the inventive concept will become more apparent by describing in detailed exemplary embodiments thereof with reference to the accompanying drawings, in which.

DETAILED DESCRIPTION OF THE INVENTION

Hereinafter, the inventive concept will be explained in detail with reference to the accompanying drawings.

Figure 1:
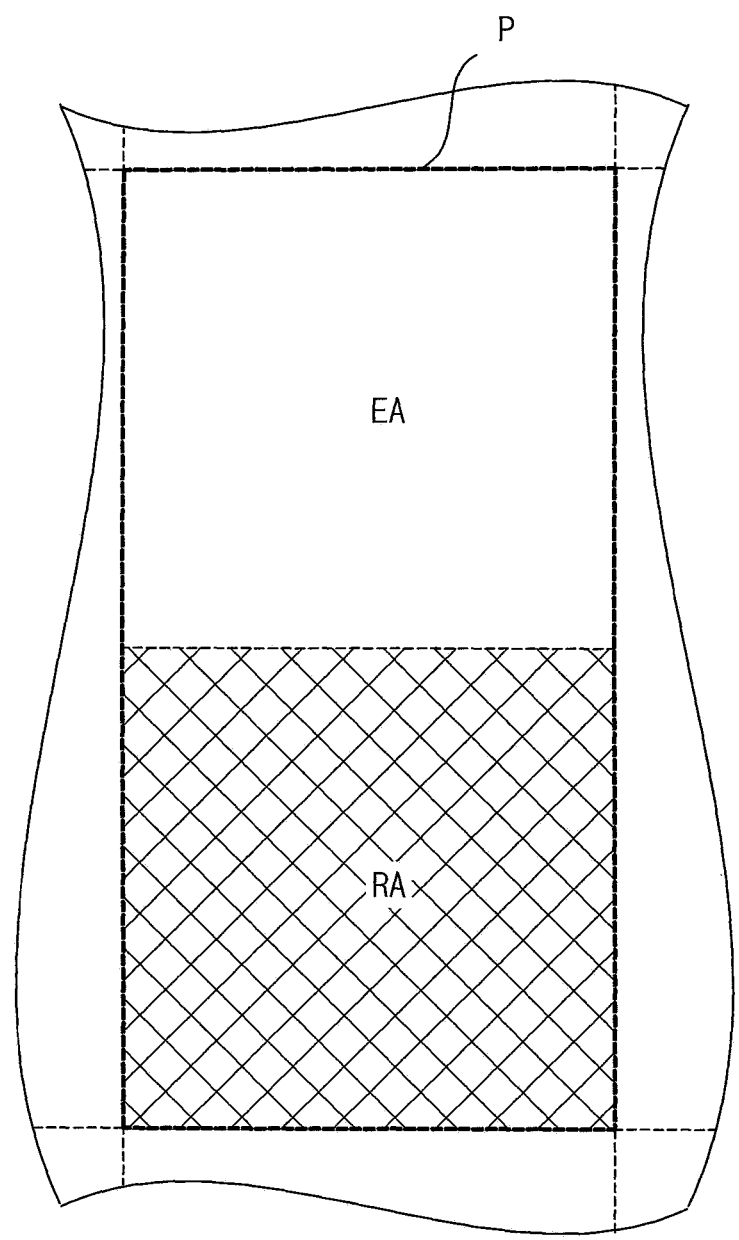
FIG. 1 is a plan view illustrating a pixel part of a display apparatus according to an exemplary embodiment.
Figure 2A:
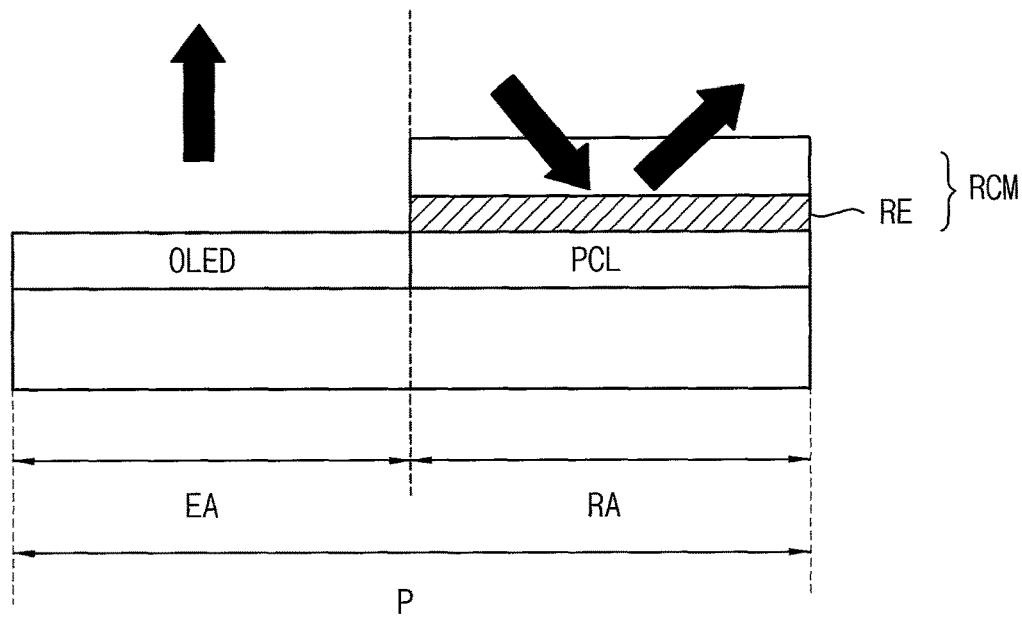
FIGS. 2A and 2B are conceptual diagrams illustrating a method of driving the display apparatus shown in FIG. 1.
Figure 2B:
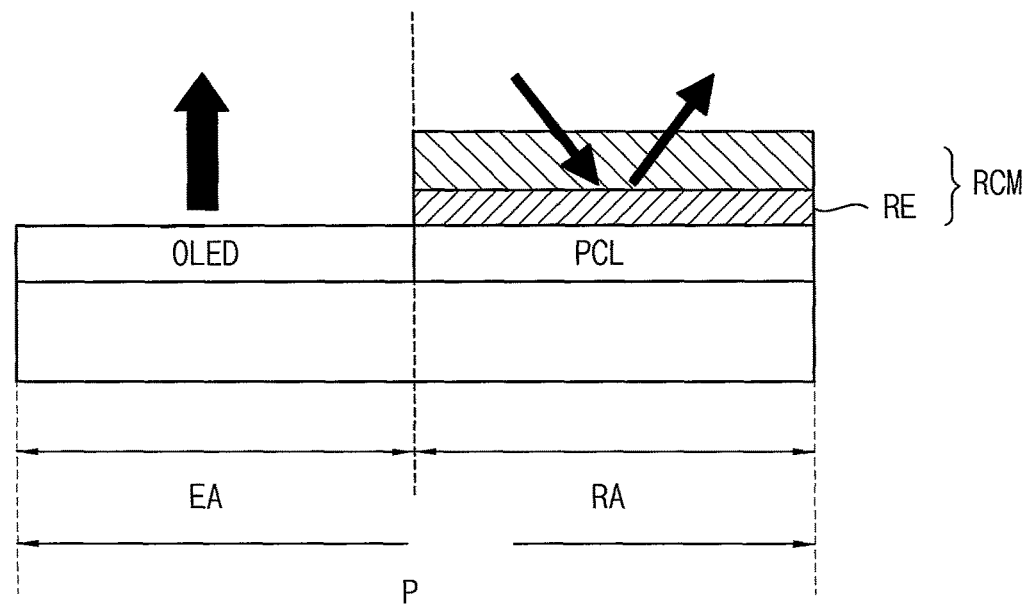

FIG. 1 is a plan view illustrating a pixel part of a display apparatus according to an exemplary embodiment. FIGS. 2A and 2B are conceptual diagrams illustrating a method of driving the display apparatus shown in FIG. 1.

Referring to FIG. 1, the display apparatus may include a plurality of pixel parts PA. Each of the plurality of pixel parts PA may include a light-emitting area EA and a reflection area RA.

An organic light emitting diode which emits a light is disposed in the light-emitting area EA. The light-emitting area EA may emit a red light, a green light, a blue light or a white light. The light-emitting area EA illustrated in FIG. 1 may be planar having a substantially square shape (or a substantially rectangular shape), but the present disclosure is not limited thereto. For example, the light-emitting area may be planar having a substantially triangle shape, a substantially diamond shape, a substantially polygonal shape, a substantially circular shape, a substantially track shape, or a substantially elliptical shape.

A reflection electrode which reflects an incident light from an external source is disposed in the reflection area RA. A pixel circuit part which drives the organic light emitting diode is disposed in the reflection area RA. The pixel circuit part may include a scan line, data line, a power source voltage line, at least one transistor and at least one capacitor. In addition, a reflection control member which controls a reflectivity of an incident light reflected from the reflection electrode based on driving signals applied to the reflection electrode may be disposed in the reflection area RA.

The reflection area RA illustrated in FIG. 1 may be planar having a substantially square shape (or a substantially rectangular shape), but the present disclosure is not limited thereto. For example, the reflection area may be planar having a substantially triangle shape, a substantially diamond shape, a substantially polygonal shape, a substantially circular shape, a substantially track shape, or a substantially elliptical shape.

Referring to FIGS. 2A and 2B, the organic light emitting diode OLED may be disposed in the light-emitting area EA. The light-emitting area EA may emit the light generated from the organic light emitting diode OLED.

The reflection control member RCM may be disposed in the reflection area RA. The reflection control member RCM may include a reflection electrode RE which reflects the incident light. The reflection control member RCM may control an intensity of the incident light reflected from the reflection electrode RE.

As shown in FIG. 2A, when the reflection control member RCM is turned off, the reflection control member RCM may drive with a transparent mode in which the incident light is mostly transmitted through the reflection control member RCM and then, the incident light is mostly reflected from the reflection electrode RE. Therefore, the reflection area RA may reflect most of the incident light through the reflection control member RCM with the transparent mode.

However, as shown in FIG. 2B, when the reflection control member RCM is turned on, the reflection control member RCM may drive with an translucent mode in which the incident light is partially transmitted through the reflection control member RCM and then the transmitted incident light is reflected from the reflection electrode RE. Therefore, the reflection area RA may reflect a portion of the incident light through the reflection control member RCM with the translucent mode.

Therefore, the reflectivity of the reflected light generated from the reflection area RA may be controlled by turning on or off the reflection control member RCM.

For example, in a room mirror display for a car used the display apparatus according to the exemplary embodiment, when an intensity of an incident light into the room mirror display is large, the reflection control member RCM is turned on to drive with the translucent mode and thus, a display quality of an image displayed on the room mirror display may be improved.

Figure 3:
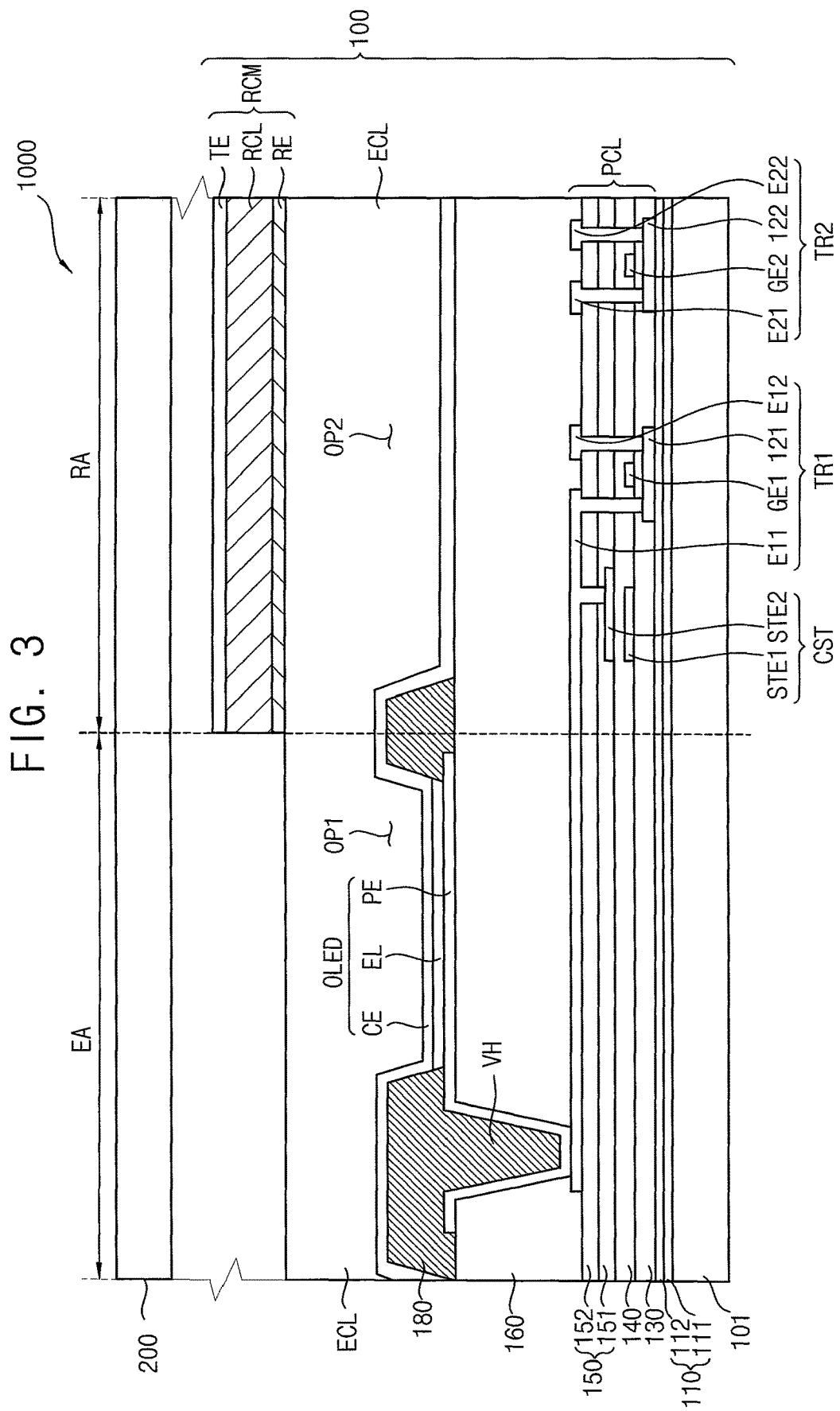
FIG. 3 is a cross-sectional view illustrating a display apparatus according to an exemplary embodiment.

FIG. 3 is a cross-sectional view illustrating a display apparatus according to an exemplary embodiment.

Referring to FIGS. 1 and 3, the display apparatus 1000 may include a display substrate 100 and an opposing substrate 200.

The display substrate 100 may include a first base substrate 101, a buffer layer 110, a pixel circuit part PCL, a planarization layer 160, a pixel electrode PE, a pixel defining layer 180, a light-emitting layer EL, a common electrode CE, an encapsulation layer ECL and reflection control member RCM.

The first base substrate 101 may be formed of transparent materials. For example, the first base substrate 101 may include a quartz substrate, a synthetic quartz substrate, a calcium fluoride substrate, a fluoride-doping quartz substrate, a sodalime substrate, a non-alkali substrate etc. Alternatively, the first base substrate 101 may be formed of a flexible transparent material such as a flexible transparent resin substrate. For example, the flexible transparent resin substrate may include a first polyimide layer, a barrier film layer, a second polyimide layer, etc.

The buffer layer 110 may be disposed on the first base substrate 101. The buffer layer 110 may prevent metal atoms and/or impurities from being diffused to the first base substrate 101. Additionally, the buffer layer 110 may improve a surface flatness of the substrate 110. According to a type of the first base substrate 101, at least two buffer layers may be provided on the first base substrate 101. For example, the buffer layer 110 may include a first layer 111 formed of silicon nitride (SiNx) and a second layer 112 formed of silicon oxide (SiOx).

The first base substrate 101 on which the buffer layer 110 is formed may include a light-emitting area EA and a reflection area RA.

An organic light emitting diode OLED may be disposed in the light-emitting area EA. For example, a plurality of insulating layers 130, 140 and 150 of the pixel circuit part PCL, the planarization layer 160, the pixel electrode PE, the pixel defining layer 180, the light-emitting layer EL, the common electrode CE and the encapsulation layer ECL may be disposed in the light-emitting area EA. The organic light emitting diode OLED may be defined by the pixel electrode PE, the light-emitting layer EL and the common electrode CE.

The planarization layer 160 may include a via-hole VH.

The pixel electrode PE may be formed of metal, alloy, metal nitride, conductive metal oxide, transparent conductive material, etc. These may be used alone or in a suitable combination thereof.

The pixel defining layer 180 may include a first opening OP1 corresponding to the light-emitting area EA and formed of a light shielding material.

The light-emitting layer EL may be disposed on the pixel electrode PE which is exposed through the first opening OP1 of the pixel defining layer 180 in the light-emitting area EA. The light-emitting layer EL may be formed using at least one of light emitting materials capable of generating different colors of light (e.g., a red light, a blue light, a green light and a white light, etc.).

The common electrode CE may be disposed on the light-emitting layer EL, and formed of a transparent conductive material.

The encapsulation layer ECL may be disposed on the common electrode CE and formed of silicon nitride and nonorganic such as metallic oxide.

The pixel circuit part PCL, the planarization layer 160, the pixel defining layer 180, the common electrode CE, the encapsulation layer ECL and the reflection control member RCM may be disposed in the reflection area RA.

The pixel circuit part PCL may include a first transistor TR1, a second transistor TR2 and a storage capacitor CST. The first transistor TR1 may include a first active pattern 121, a first gate electrode GE1, a first electrode E11 and a second electrode E12. The second transistor TR2 may include a second active pattern 122, a second gate electrode GE2, a first electrode E21 and a second electrode E22. The storage capacitor CST may include a first storage electrode STE1 and a second storage electrode STE2.

As shown in FIG. 3, the first and second active patterns 121 and 122 are disposed on the buffer layer 110 in the light-emitting area EA. For example, first and second active patterns 121 and 122 may be formed of an oxide semiconductor, an inorganic semiconductor (e.g., amorphous silicon, polysilicon, etc.), an organic semiconductor, etc.

A gate insulating layer 130 may be formed on the buffer layer 110 in the light-emitting area EA in which the first and second active patterns 121 and 122 are formed. The gate insulating layer 130 may be formed of silicon oxide (SiOx), silicon nitride (SiNx), silicon oxynitride (SiOxNy), silicon oxycarbide (SiOxCy), silicon carbon nitride (SiCxNy), aluminium oxide (AlOx), aluminium nitride (AlNx), tantalum oxide (TaOx), hafnium oxide (HfOx), zirconium oxide (ZrOx), titanium oxide (TiOx), etc.

A first storage electrode STE1, a first gate electrode GE1 and a second gate electrode GE2 may be formed using a gate metal layer and disposed on the gate insulating layer 130 in the light-emitting area EA. The gate metal layer may be formed of metal, alloy, metal nitride, conductive metal oxide, transparent conductive material, etc.

A first insulating interlayer 140 in the light-emitting area EA may be disposed on the first base substrate 101 on which the first storage electrode STE1, the first gate electrode GE1 and the second gate electrode GE2 are disposed. The first insulating interlayer 140 may be formed of silicon oxide (SiOx), silicon nitride (SiNx), silicon oxynitride (SiOxNy), etc. These may be used alone or in a suitable combination thereof.

The second storage electrode STE2 may be formed using the gate metal layer, and disposed on the first insulating interlayer 140 in the light-emitting area EA.

For example, the gate metal layer may be formed of aurum (Au), argentum (Ag), aluminum (Al), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), aluminium alloy, aluminium nitride (AlNx), argentum alloy, tungsten W, tungsten nitride (WNx), copper alloy, molybdenum alloy, titanium nitride (TiNx), tantalum nitride (TaNx), strontium ruthenium oxide (SrRuxOy), zinc oxide (ZnOx), indume tin oxide (ITO), stannum oxide (SnOx), indume oxide (InOx), gallium oxide (GaOx), indume zinc oxide (IZO), etc., which may be used alone or in combination thereof.

A second insulating interlayer 150 in the light-emitting area EA may be disposed on the first base substrate 101 on which the second storage electrode STE2 is formed. The second insulating interlayer 150 may be formed of silicon oxide (SiOx), silicon nitride (SiNx), silicon oxynitride (SiOxNy), etc. These may be used alone or in a suitable combination thereof. For example, the second insulating interlayer 150 may include a first layer 151 formed of silicon oxide (SiOx) and a second layer 152 formed of silicon nitride (SiNx).

First and second electrodes E11 and E12 of the first transistor TR1 and first and second electrodes E21 and E22 of the second transistor TR2 may be formed using a source metal layer, and disposed on the second insulating interlayer 150 in the light-emitting area EA. The source metal layer may be formed of metal, alloy, metal nitride, conductive metal oxide, transparent conductive material, etc. These may be used alone or in a suitable combination thereof.

The planarization layer 160 may be disposed on the pixel circuit part PCL which includes the first and second electrodes E11, E12, E21 and E22.

The pixel defining layer 180 may include a second opening OP2 corresponding to the reflection area RA, and formed of a light shielding material.

The common electrode CE may be disposed in all the light-emitting area EA and the reflection area RA. In the reflection area RA, the common electrode CE may be disposed on the planarization layer 160 which is exposed through the second opening OP2 of the pixel defining layer 180.

The encapsulation layer ECL may be disposed on the common electrode CE in all the light-emitting area EA and the reflection area RA.

The reflection control member RCM may include a reflection electrode RE, a reflection control layer RCL and a transparent electrode TE.

The reflection electrode RE may be disposed on the encapsulation layer ECL in the reflection area RA. The reflection electrode RE may be formed of materials for reflecting a light. For example, the reflection electrode RE may be formed of aluminum (Al), neodymium (Nd), aluminum alloy, etc.

The reflection control layer RCL may include an electrochromic layer, a liquid crystal layer and an electrophoresis layer.

The transparent electrode TE may be disposed on the reflection control layer RCL. The transparent electrode TE may be formed of transparent conductive material.

The opposing substrate 200 may be opposite to the display substrate 100 and be combined with the display substrate 100. The opposing substrate 200 may be formed of transparent materials. For example, the opposing substrate 200 may include a quartz substrate, a synthetic quartz substrate, a calcium fluoride substrate, a fluoride-doping quartz substrate, a sodalime substrate, a non-alkali substrate etc. Alternatively, the opposing substrate 200 may be formed of a flexible transparent material such as a flexible transparent resin substrate. For example, the flexible transparent resin substrate may include a first polyimide layer, a barrier film layer, a second polyimide layer, etc.

According to the exemplary embodiment, the light-emitting area EA of the display apparatus may display an image and the reflection area RA of the display apparatus may reflect the incident light as a mirror. In addition, the reflection control member RCM in the reflection area RA may control a reflectivity based on the intensity of an incident light of the display apparatus, such that the display quality may be improved. In addition, the reflection electrode may be used as a driving electrode of the reflection control member such that a thickness of the display substrate may be decreased.

Figure 4:
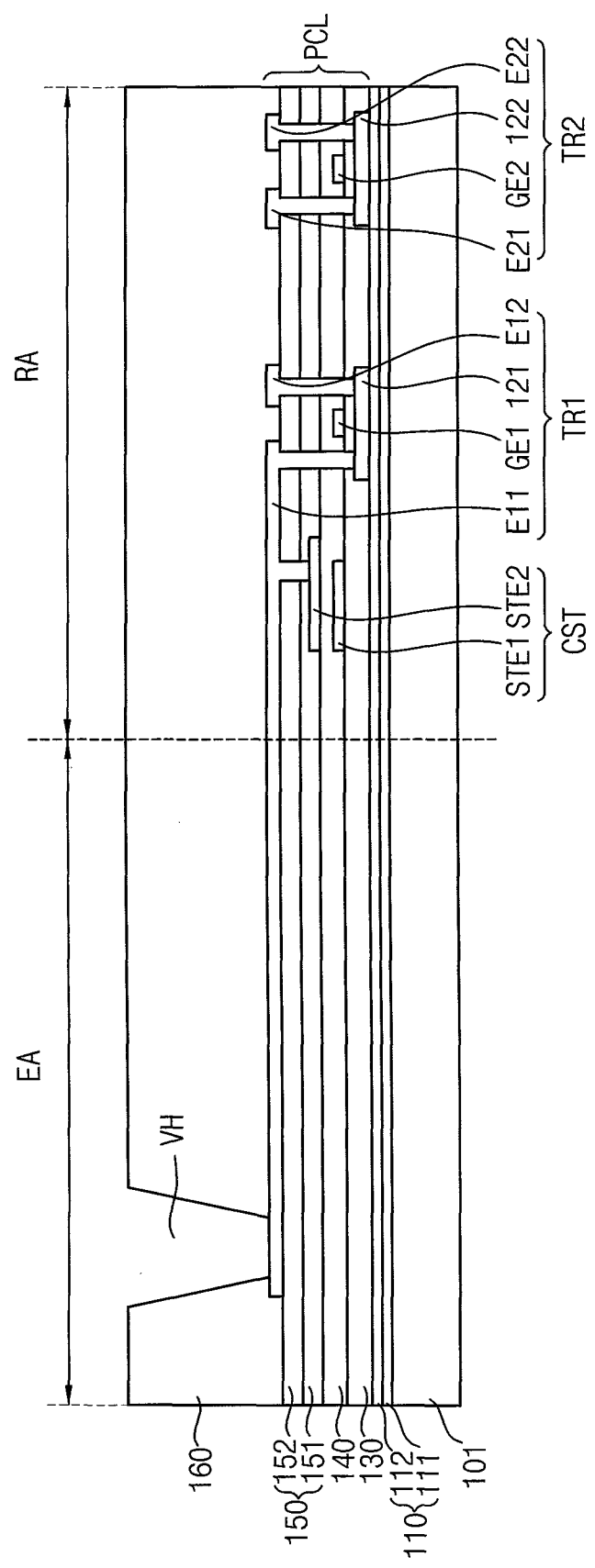
FIGS. 4, 5, and 6 are cross-sectional views illustrating a method of manufacturing a display substrate according to an exemplary embodiment.
Figure 5:
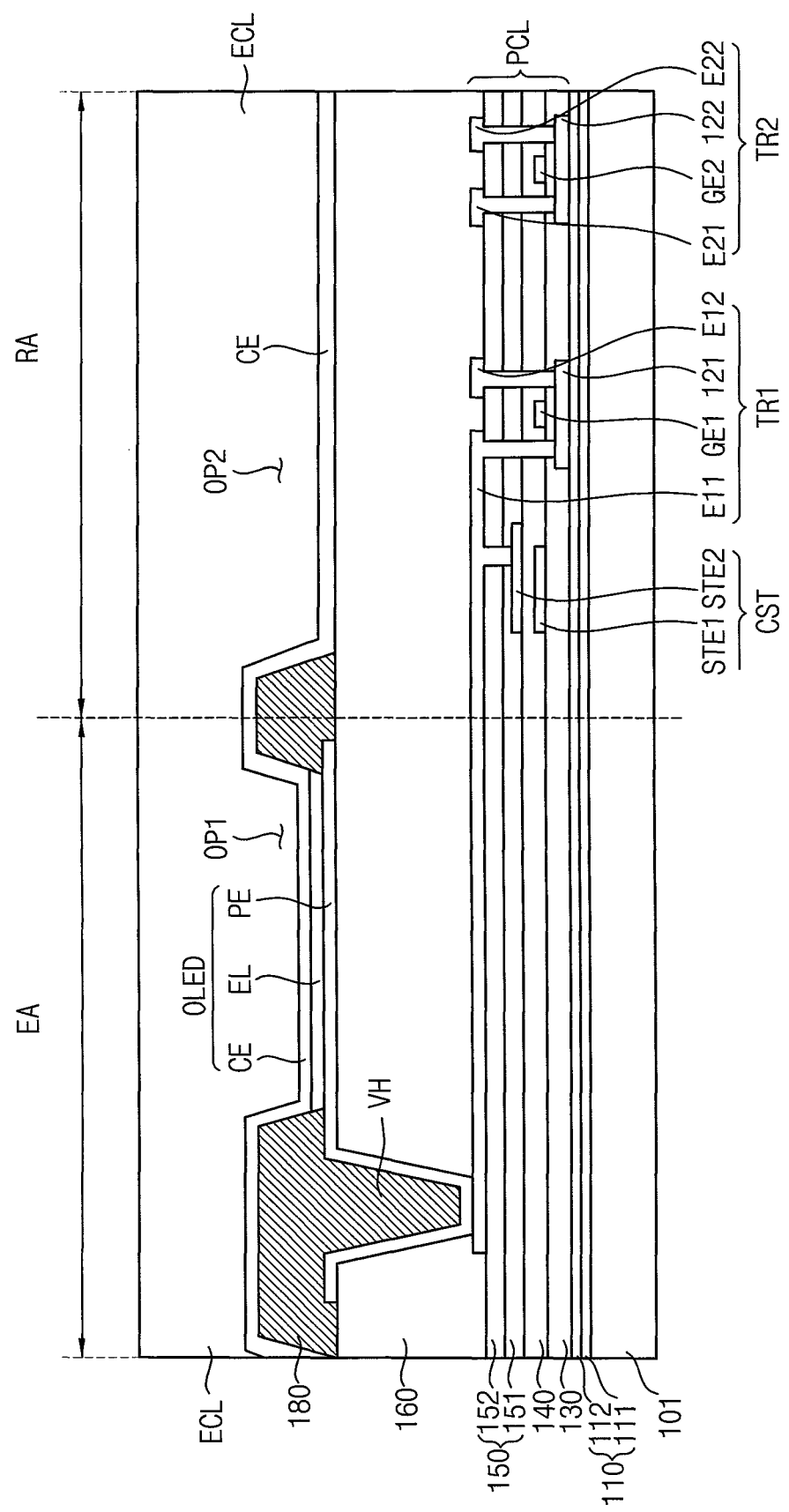
Figure 6:
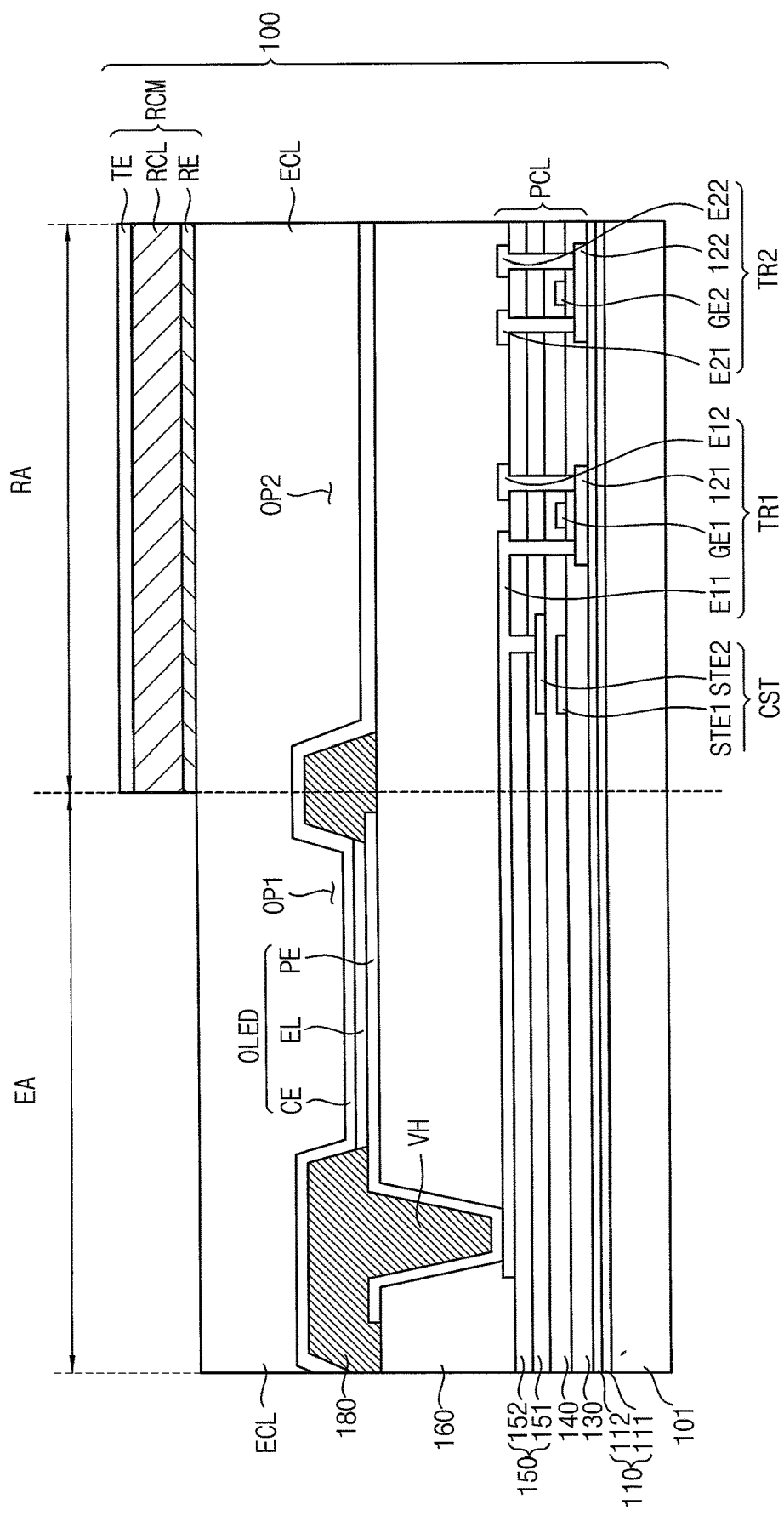

FIGS. 4 to 6 are cross-sectional views illustrating a method of manufacturing a display substrate according to an exemplary embodiment.

Referring to FIGS. 3 and 4, the first base substrate 101 may include a quartz substrate, a synthetic quartz substrate, a calcium fluoride substrate, a fluoride-doping quartz substrate, a sodalime substrate, a non-alkali substrate etc.

A buffer layer 110 may be generally formed on the first base substrate 101. The buffer layer 110 may prevent the diffusion of metal atoms and/or impurities from the first base substrate 101. The buffer layer 110 may have a multi-layer structure. For example, the buffer layer 110 may include a first layer 111 formed of silicon nitride (SiNx) and a second layer 112 formed of silicon oxide (SiOx).

An active layer may be formed on the buffer layer 110. The active layer may be formed of an oxide semiconductor, an inorganic semiconductor (e.g., amorphous silicon, polysilicon, etc.), an organic semiconductor, etc. The active layer may be patterned to form a first active pattern 121 of the first transistor TR1 and a second active pattern 122 of the second transistor TR2.

A gate insulating layer 130 may be formed on the first base substrate 101 on which the first and second active patterns 121 and 122 are formed. The gate insulating layer 130 may be formed of silicon oxide (SiOx), silicon nitride (SiNx), silicon oxynitride (SiOxNy), silicon oxycarbide (SiOxCy), silicon carbon nitride (SiCxNy), aluminium oxide (AlOx), aluminium nitride (AlNx), tantalum oxide (TaOx), hafnium oxide (HfOx), zirconium oxide (ZrOx), titanium oxide (TiOx), etc.

A gate metal layer may be formed on the gate insulating layer 130. The gate metal layer may be formed of metal, alloy, metal nitride, conductive metal oxide, transparent conductive material, etc. The gate metal layer may be patterned to from a first gate metal pattern. The first gate metal pattern may include a first storage electrode STE1, a first gate electrode GE1 and a second gate electrode GE2.

A first insulating interlayer 140 may be formed on first base substrate 101 on which the first storage electrode STE1, the first gate electrode GE1 and the second gate electrode GE2 are formed. The first insulating interlayer 140 may be formed of silicon oxide, silicon nitride, silicon oxynitride, etc., which may be used alone or in combination thereof.

The gate metal layer may be formed on the first insulating interlayer 140. The gate metal layer may be pattern to form a second gate metal pattern. The second gate metal pattern may include a second storage electrode STE2.

A second insulating interlayer 150 may be formed on the first base substrate 101 on which the second storage electrode STE2 is formed. The second insulating interlayer 150 may include a first layer 151 formed of silicon oxide (SiOx) and a second layer 152 formed of silicon nitride (SiNx).

A source metal layer may be formed on the second insulating interlayer 150. The source metal layer may be patterned to form a source metal pattern. The source metal pattern may include first and second electrodes E11 and E12 of the first transistor TR1 and first and second electrodes E21 and E22 of the second transistor TR2. The source metal pattern, the first gate metal pattern and the second gate metal pattern may be connected to each other through the plurality of contact holes.

The planarization layer 160 may be formed on the first base substrate 101 on which the first and second electrodes E11 and E12 of the first transistor TR1 and the first and second electrodes E21 and E22 of the second transistor TR2 are formed. The planarization layer 160 may be formed of organic material and inorganic material.

The planarization layer 160 may be patterned to form a via-hole VH which exposes the first electrode E11 of the first transistor in the light-emitting area EA.

Referring to FIGS. 3 and 5, a pixel electrode PE may be formed on the first base substrate 101 on which the via-hole VH and the transmission window TW are formed. The pixel electrode PE may be formed of metal, alloy, metal nitride, conductive metal oxide, transparent conductive material, etc. These may be used alone or in a suitable combination thereof.

A pixel defining layer 180 may be formed on the first base substrate 101 on which the pixel electrode PE is formed. The pixel defining layer 180 may be formed of a light shielding material. The pixel defining layer 180 is patterned to form a first opening OP1 which exposes the pixel electrode PE in the light-emitting area EA and a second opening OP2 which exposes the planarization layer 160 in the reflection area RA.

A light-emitting layer EL may be formed in the first opening OP1. The light-emitting layer EL may be formed using at least one of light emitting materials capable of generating different colors of light (e.g., a red light, a blue light, a green light and a white light, etc.).

A common electrode CE may be formed in all the light-emitting area EA and the reflection area RA of the first base substrate 101 on which the light-emitting layer EL is formed.

The common electrode CE in the light-emitting area EA may be disposed on the light-emitting layer EL and the common electrode CE in the reflection area RA may be disposed on the planarization layer 160.

The encapsulation layer ECL may be thickly formed in all the light-emitting area EA and the reflection area RA of the first base substrate 101 on which the common electrode CE is formed. The encapsulation layer ECL may be formed of silicon nitride and nonorganic such as metallic oxide. A surface of the display substrate may be planarized by the encapsulation layer ECL.

Referring to FIGS. 3 and 6, the reflection electrode RE may be formed in the reflection area RA of the first base substrate 101 on which the encapsulation layer ECL is formed.

The reflection electrode RE may be formed of materials for reflecting a light. For example, the reflection electrode RE may be formed of aluminum (Al), neodymium (Nd), aluminum alloy, etc.

The reflection control layer RCL may be formed on the first base substrate 101 on which the reflection electrode RE is formed.

The reflection control layer RCL may be driven with the transparent mode and a translucent mode. The reflection control layer RCL may include an electrochromic layer, a liquid crystal layer and an electrophoresis layer.

The transparent electrode TE may be formed on the reflection control layer RCL.

Therefore, the reflection control member RCM which includes the reflection electrode RE, the reflection control layer RCL and the transparent electrode TE may be formed in the reflection area RA.

According to the exemplary embodiment, the reflection area RA of the display apparatus may reflect the incident light as a mirror. In addition, the reflection control member RCM in the reflection area RA may control a reflectivity based on the intensity of an incident light of the display apparatus, such that the display quality may be improved. In addition, the reflection electrode may be used as a driving electrode of the reflection control member such that a thickness of the display substrate may be decreased.

Figure 7:
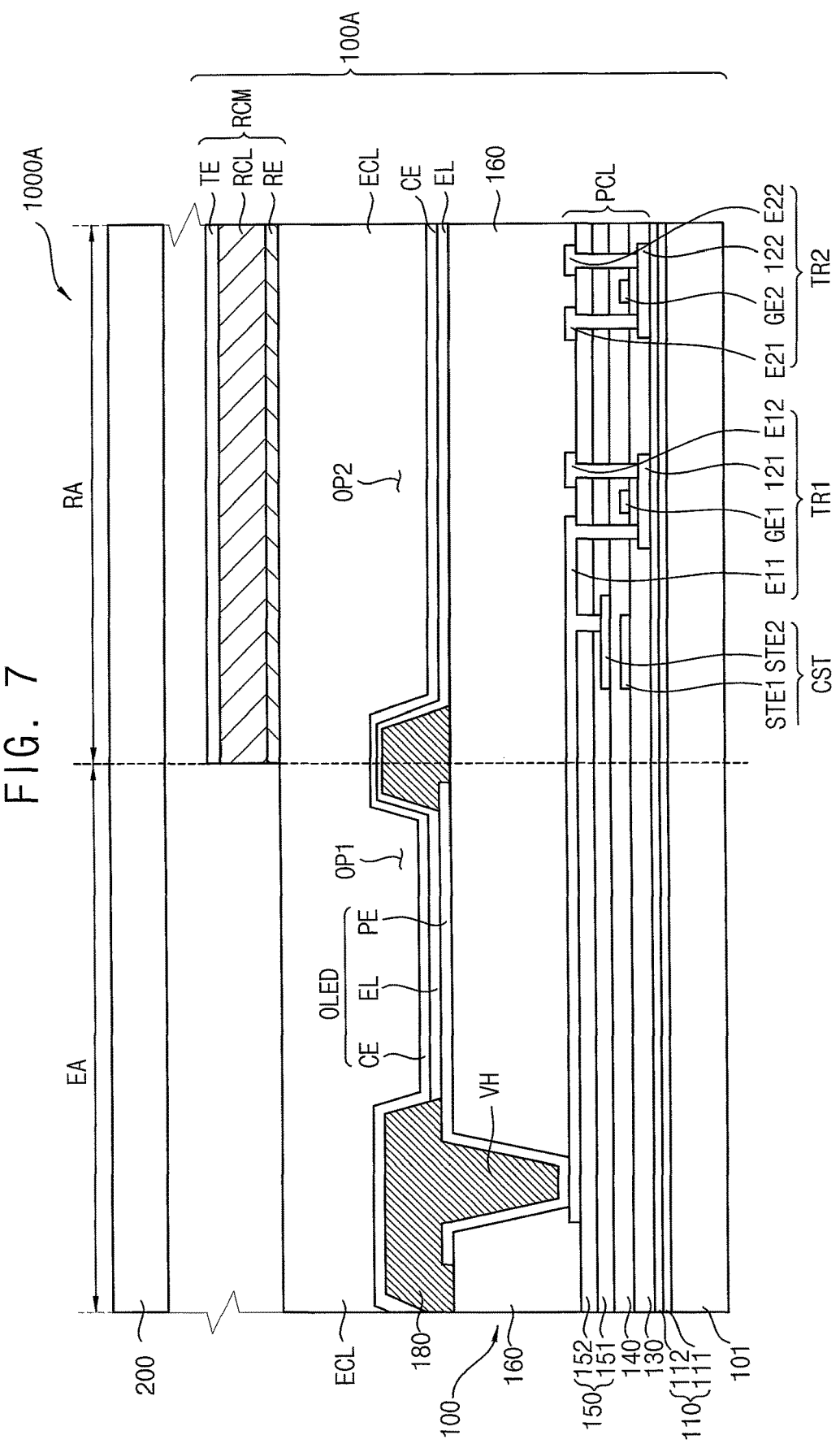
FIG. 7 is a cross-sectional view illustrating a display apparatus according to an exemplary embodiment.

FIG. 7 is a cross-sectional view illustrating a display apparatus according to an exemplary embodiment.

Referring to FIG. 7, the display apparatus 1000A may include a display substrate 100A and an opposing substrate 200.

According to the exemplary embodiment, the display substrate 100A in comparison with the display substrate 100 according to the previous exemplary embodiment referring to FIG. 3 may include a light-emitting layer EL which is commonly formed in all, or at least a portion of each of, the light-emitting area EA and the reflection area RA.

Therefore, according to the exemplary embodiment, in the reflection area RA, the light-emitting layer EL may be disposed on the planarization layer 160 which is exposed through the second opening OP2 of the pixel defining layer 180, the common electrode CE may be disposed on the light-emitting layer EL, the encapsulation layer ECL may be disposed on the common electrode CE, and the reflection control member RCM including the reflection electrode RE may be disposed on the encapsulation layer ECL.

A method of manufacturing the display substrate 100A in comparison with the method of manufacturing the display substrate 100 according to the previous exemplary embodiment referring to FIGS. 3 to 6, may decrease a number of a mask for forming the light-emitting layer EL.

Figure 8:
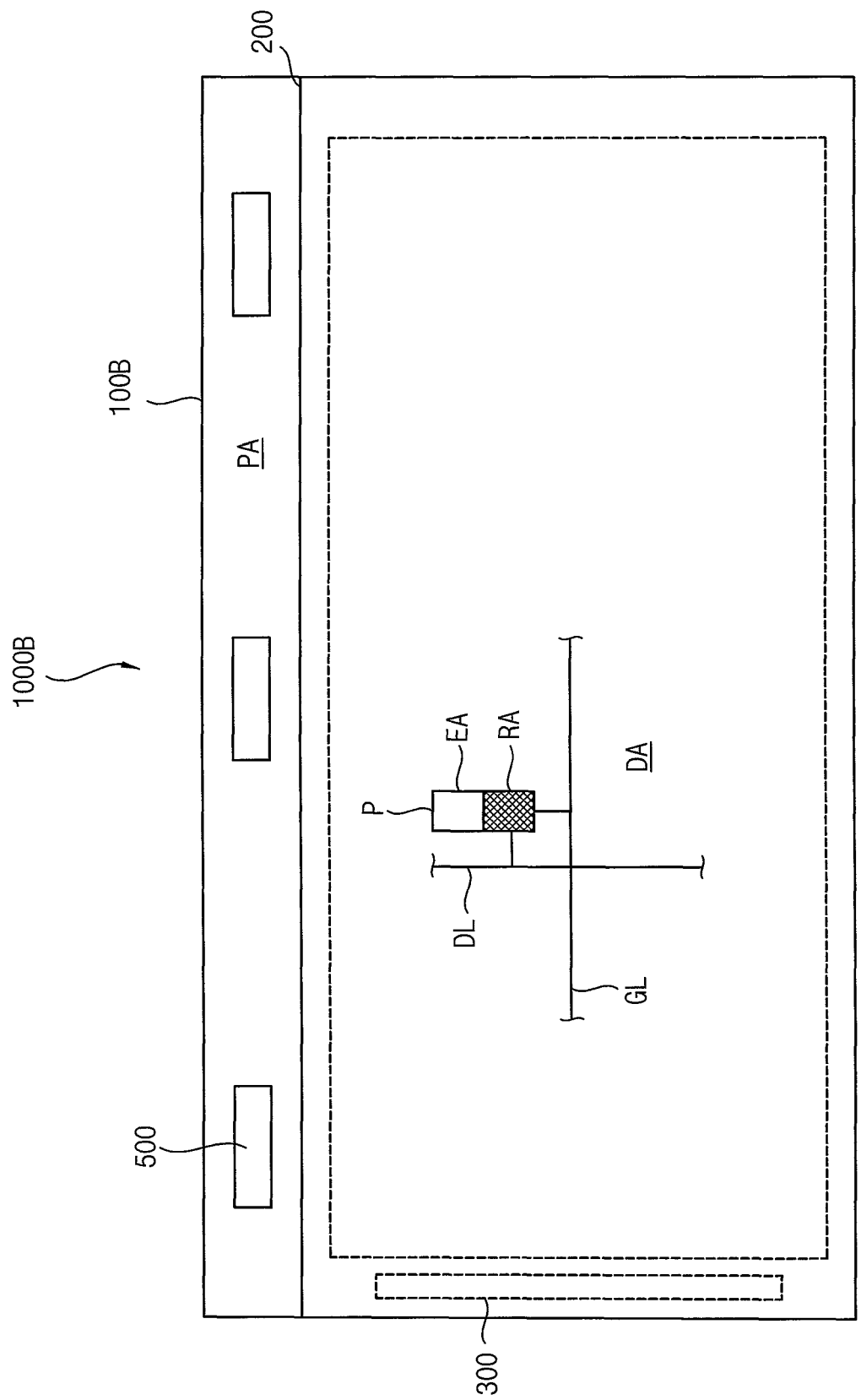
FIG. 8 is a cross-sectional view illustrating a display apparatus according to an exemplary embodiment.
Figure 9:
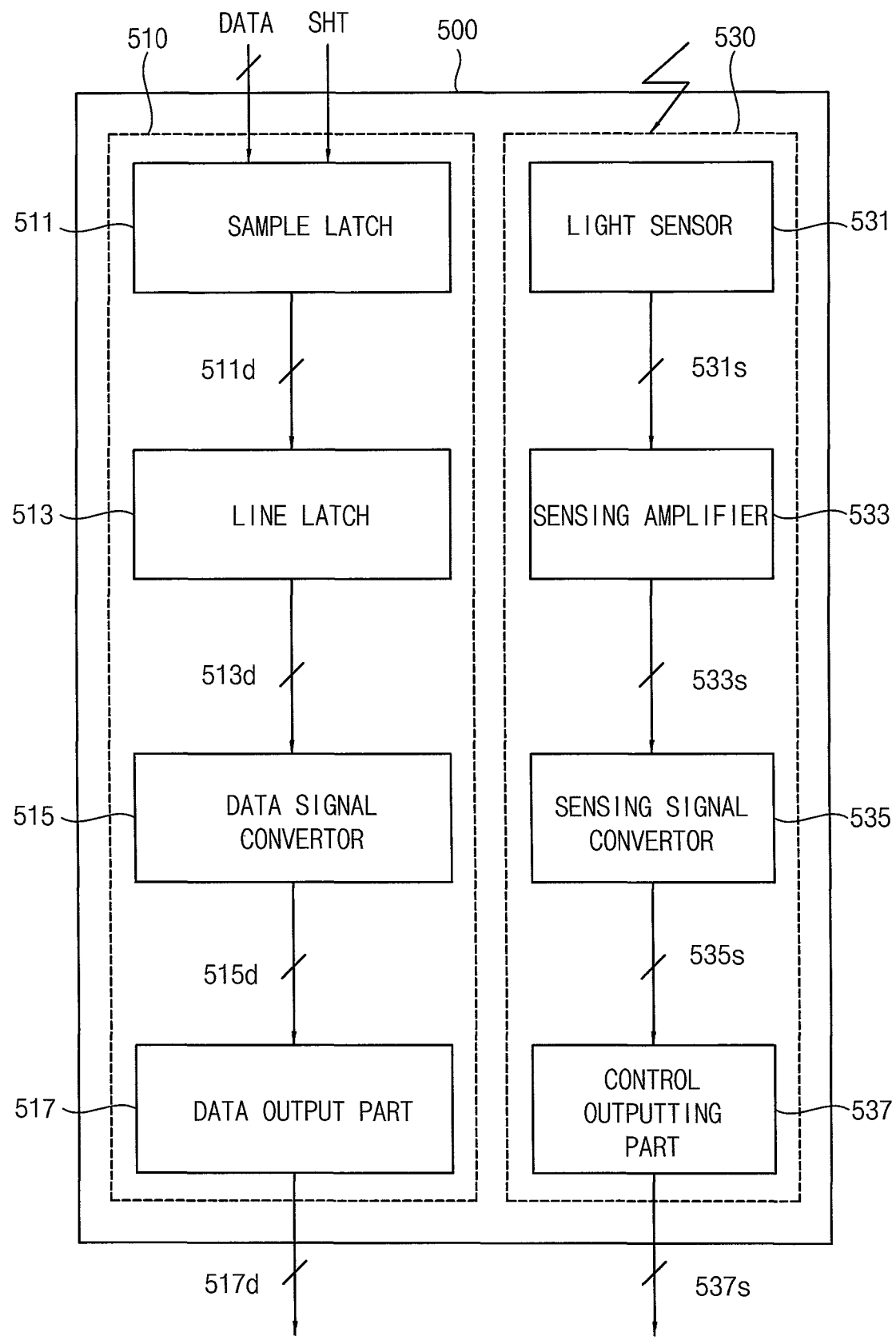
FIG. 9 is a block diagram illustrating a data driver circuit according to an exemplary embodiment.

FIG. 8 is a cross-sectional view illustrating a display apparatus according to an exemplary embodiment. FIG. 9 is a block diagram illustrating a data driver circuit according to an exemplary embodiment.

Referring to FIG. 8, according to the exemplary embodiment, the display apparatus 1000B may include a display substrate 100B, an opposing substrate 200 opposite to the display substrate 100B, a gate driver circuit 300 and at least one data driver circuit 500.

The display substrate 100B may include a display area DA and a peripheral area PA surrounding the display area DA.

A plurality of pixels P, a plurality of data lines DL and a plurality of gate lines GL may be disposed in the display area DA.

Each of the plurality of pixel parts P may include the same or like parts as those of the pixel described in the previous exemplary embodiments.

The pixel P may include a light-emitting area EA which emits a light and a reflection area RA which reflects a light. The light-emitting area EA may include an organic light emitting diode, and the reflection area RA may include a pixel circuit part which drives the organic light emitting diode. The pixel circuit part may include at least one transistor and at least one capacitor and may be connected to at least one data line DL and at least one gate line GL.

The gate driver circuit 300 may be disposed in the peripheral area PA. The gate driver circuit 300 may be configured to provide the at least one transistor in the pixel circuit part with a gate signal. The gate driver circuit 300 may include a plurality of transistors which is disposed in peripheral area PA of the display substrate 100B and formed via the process substantially same as that forming the at least one transistor in the pixel circuit part.

The data driver circuit 500 may be disposed in the peripheral area PA. The data driver circuit 500 may be configured to provide the at least one transistor in the pixel circuit part with a data signal.

In addition, the data driver circuit 500 may be configured to sense the light incident from the external and to generate driving signals to drive the reflection control member in the reflection area RA based on a sensing signal corresponding to an intensity of the incident light.

The reflection control member may include a reflection electrode, a reflection control layer and a transparent electrode as those described in the previous exemplary embodiments, and the reflection electrode and the transparent electrode of the reflection control member may be configured to receive the driving signals outputted from the data driver circuit 500. The reflection control member may be driven with the transparent mode and the translucent mode based on the driving signals corresponding to the intensity of the incident light.

For example, when the incident light has the intensity of normal illumination, the reflection control member may be driven with the transparent mode and thus the incident light is mostly transmitted to be incident into the reflection electrode. When the incident light has the intensity of high illumination, the reflection control member may be driven with the translucent mode and thus the incident light is partially transmitted to be incident into the reflection electrode. Thus, the reflection control member may control a reflectivity of the light reflected from the reflection electrode based on the intensity of the incident light.

Referring to FIG. 9, the data driver circuit 500 may include a data circuit part 510 and a sensor circuit part 530.

The data circuit part 510 may include a sample latch 511, a line latch 513, a data signal convertor 515 and a data output part 517.

The sample latch 511 may be configured to receive an image signal which is R, G and B data DATA and arrange the R, G and B data DATA based on a shift control signal SHT.

The line latch 513 may be configured to store the R, G and B data 511d outputted from the sample latch 511 by a horizontal line unit. The line latch 513 may be configured to output the R, G and B data 513d by the horizontal line unit based on a load signal TP.

The data signal convertor 515 may be configured to convert the R, G and B data received from the line latch 513 of a digital signal to R, G and B data voltages of an analog signal using a gamma voltage V_GAMMA. The data signal convertor 515 may be configured to output the R, G and B data voltages 515d.

The data output part 537 may be configured to amplify the R, G and B data voltages to predetermined levels and then the amplified R, G and B data voltages 517d may be outputted to the plurality of data lines.

The sensor circuit part 530 may include a light sensor 531, a sensing amplifier 533, a sensing signal convertor 535 and a control outputting part 537.

The light sensor 531 may include at least one light-current sensing element. The light-current sensing element may be configured to turn on and to output a sensing signal 531s corresponding to the light-current when a light is received into a channel area. The light sensor 531 may be configured to output a plurality of sensing signal 531s outputted from the plurality of light-current sensing elements.

The sensing amplifier 533 may be configured to amplify a level of the sensing signal to a predetermined level. The sensing amplifier 533 may be configured to output a plurality of sample sensing signals 533s amplified to the predetermined level.

The sensing signal convertor 535 may be configured to convert the sample sensing signal 533s of an analog signal to sensing data 535s of a digital signal. The sensing signal convertor 535 may be configured to output a plurality of sensing data 535s.

The control outputting part 537 may be configured to store the plurality of sensing data 535s at a memory such as a resistor by a predetermined period and to determine an intensity of the incident light based on the plurality of sensing data 535s stored in the memory. For example, the control outputting part 537 may be configured to determine a maximum value of the plurality of sensing data 535s as the intensity of the incident light.

The control outputting part 537 may be configured to output driving signals to drive the reflection control member RCM based on the determined intensity of the incident light.

For example, when the sensing data corresponding to the intensity of the incident light are lower than reference data, the control outputting part 537 may be configured to determine the intensity of the incident light as a normal intensity. And then, the control outputting part 537 may be configured to generate first and second driving signals applied to the reflection electrode and the transparent electrode to drive the reflection control member RCM with a transparent mode. In the transparent mode, the first and second driving signals may have same voltage levels as each other.

However, when the sensing data corresponding to the intensity of the incident light are higher than the reference data, the control outputting part 537 may be configured to determine the intensity of the incident light as an abnormal intensity. And then, the control outputting part 537 may be configured to generate the first and second driving signals applied to the reflection electrode and the transparent electrode to drive the reflection control member RCM with a translucent mode. In the translucent mode, the first and second driving signals may have different voltage levels from each other.

Therefore, the reflectivity of the reflection area may be controlled based on the intensity of the incident light and thus, a visibility of an image displayed on the display apparatus may be improved.

According to the exemplary embodiment, the data circuit part and the sensor circuit part may be formed as single chip using a TSV (Through Silicon Via) technology and thus a thickness and a size of the data driver circuit may decrease. In addition, the reflection electrode for the mirror may be used as the driving electrode of the reflection control member and thus, a thickness of the display apparatus may decrease.

Figure 10:
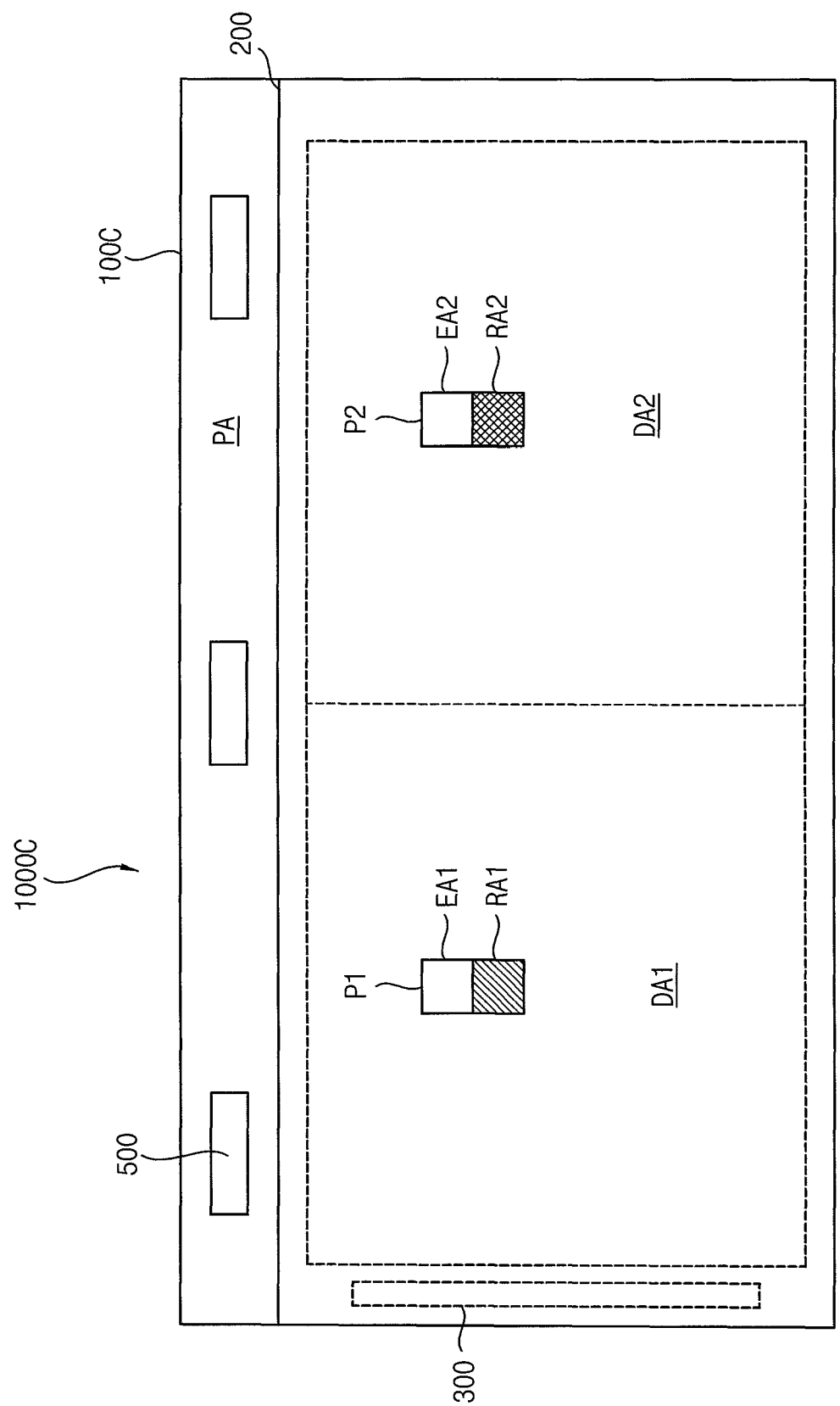
FIG. 10 is a plain view illustrating a display apparatus according to an exemplary embodiment.
Figure 11:
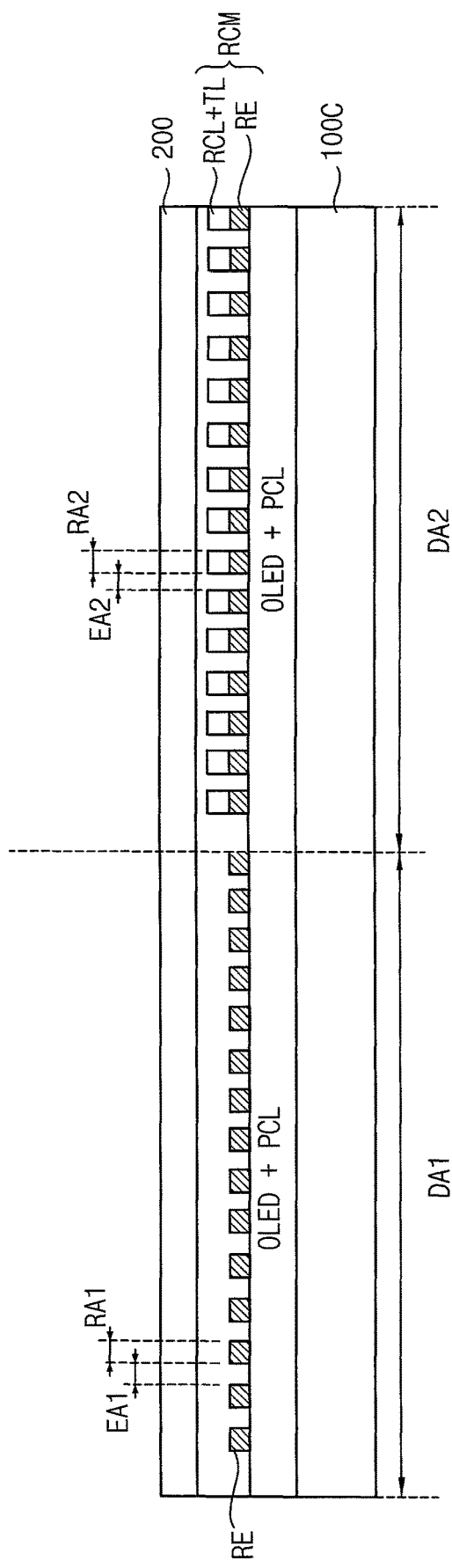
FIG. 11 is a cross-sectional view illustrating the display apparatus shown in FIG. 10.

FIG. 10 is a plain view illustrating a display apparatus according to an exemplary embodiment. FIG. 11 is a cross-sectional view illustrating the display apparatus shown in FIG. 10.

According to the exemplary embodiment, the display apparatus 1000C in comparison with the display apparatus 1000B according to the previous exemplary embodiment referring to FIG. 3 may include a display area DA which is divided a first display area DA1 and a second display area DA2. Hereinafter, the same reference numerals are used to refer to the same or like parts as those described in the previous exemplary embodiments, and the same detailed explanations are not repeated unless necessary.

Referring to FIGS. 10 and 11, the display apparatus 1000C may include a display substrate 100C, an opposing substrate 200 opposite to the display substrate 100C, a gate driver circuit 300 and at least one data driver circuit 500.

The display substrate 100C may include a first display area DA1, a second display area DA2 and a peripheral area PA surrounding the first and second display areas DA1 and DA2.

A plurality of first pixels P1, a plurality of data lines and a plurality of gate lines which are connected to the first pixels P1 may be disposed in the first display area DA1.

A first pixel P1 in the first display area DA1 may include a first light-emitting area EA1 and a first reflection area RA1.

The same or like parts as those disposed in light-emitting area EA according to the previous exemplary embodiment referring to FIG. 3 may be disposed in the first light-emitting area EA1 of the first pixel P1 according to the exemplary embodiment. Thus, an organic light emitting diode OLED may be disposed in the first light-emitting area EA1.

However, the reflection control layer RCL and the transparent electrode TE disposed in the reflection area RA according to the previous exemplary embodiment referring to FIG. 3 may be omitted in the first reflection area RA1 of the first pixel P1 according to the exemplary embodiment. Thus, a pixel circuit part PCL which includes at least one transistors T1 and T2 and at least one capacitor Cst and a reflection electrode RE may be disposed in the first reflection area RA1.

The reflection electrode of the first reflection area RA1 may intactly reflect an incident light. Thus, the first display area DA1 may display an image and reflect the incident light as a mirror.

A plurality of second pixels P2, a plurality of data lines and a plurality of gate lines which are connected to the second pixels P2 may be disposed in the second display area DA2.

A second pixel P2 of the second display area DA2 may include a second light-emitting area EA2 and a second reflection area RA2.

The same or like parts as those disposed in light-emitting area EA according to the previous exemplary embodiment referring to FIG. 3 may be disposed in the second light-emitting area EA2 of the second pixel P2 according to the exemplary embodiment. Thus, an organic light emitting diode OLED may be disposed in the second light-emitting area EA2.

In addition, the same or like parts as those disposed in reflection area RA according to the previous exemplary embodiment referring to FIG. 3 may be disposed in the second reflection area RA2 of the second pixel P2 according to the exemplary embodiment. Thus, a pixel circuit part PCL and a reflection control member RCM which includes a reflection electrode RE, a reflection control layer RCL and a transparent electrode TE may be disposed in the second reflection area RA2.

Therefore, the second display area DA2 may display an image and control a reflectivity based on the intensity of the incident light.

According to the exemplary embodiment, the pixels in a partial area of the display area may selectively the reflection control layer and the transparent electrode. Thus, the display area may include a first area performing a mirror function unrelated to the intensity of the incident light and a second area controlling the reflectivity of the reflected light from the reflection electrode based on the intensity of the incident light.

According to the exemplary embodiment, the data circuit part and the sensor circuit part may be formed as a single chip using a TSV (Through Silicon Via) technology and thus a thickness and a size of the data driver circuit may decrease. In addition, the reflection electrode for the mirror may be used as the driving electrode of the reflection control member and thus, a thickness of the display apparatus may decrease.

Figure 12:
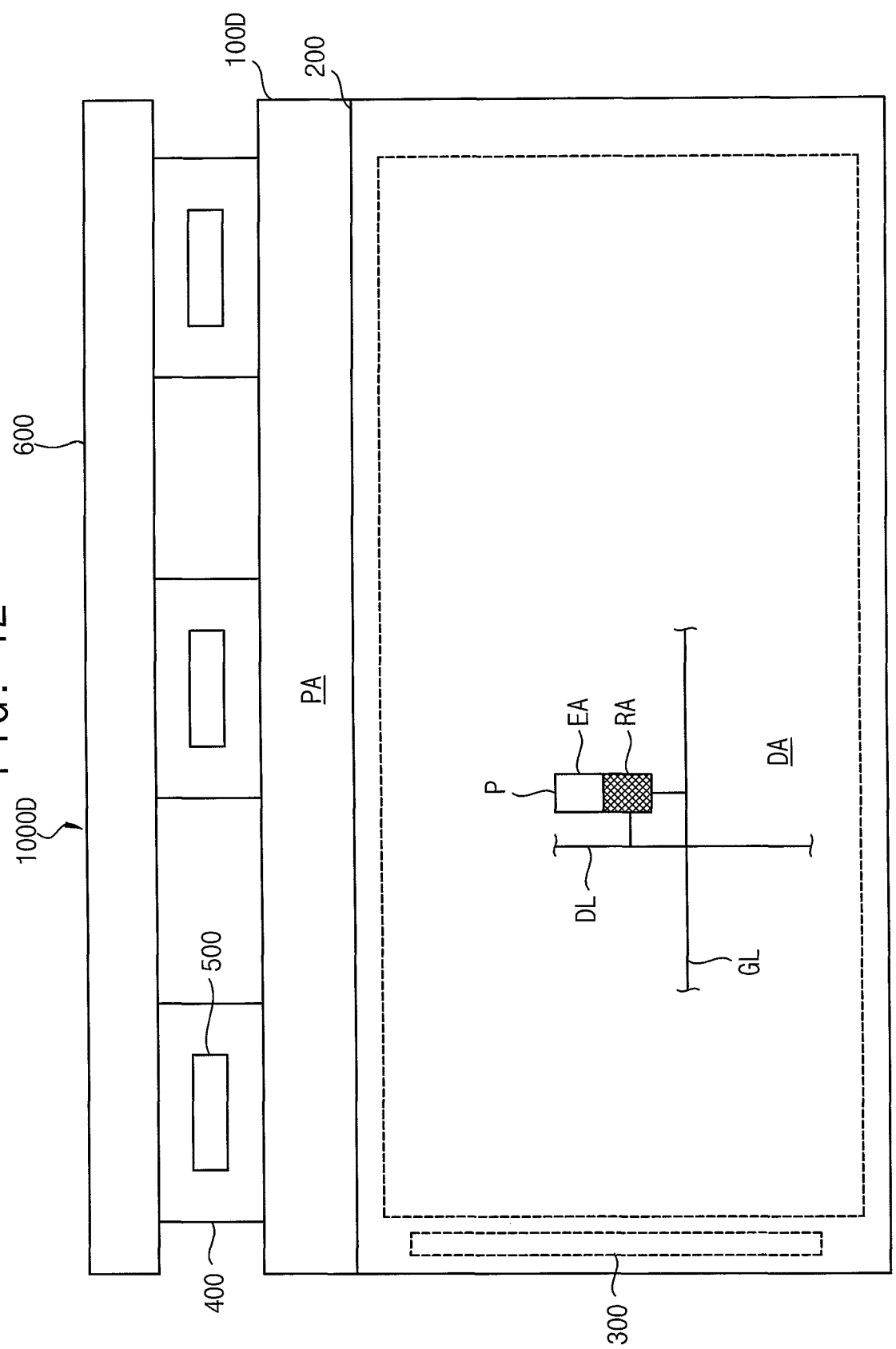
FIG. 12 is a cross-sectional view illustrating a display apparatus according to an exemplary embodiment.

FIG. 12 is a cross-sectional view illustrating a display apparatus according to an exemplary embodiment.

According to the exemplary embodiment, the display apparatus 1000D may include a data driver circuit 500 which is disposed on a flexible circuit board in comparison with the display apparatus 1000B according to the previous exemplary embodiment. Hereinafter, the same reference numerals are used to refer to the same or like parts as those described in the previous exemplary embodiments, and the same detailed explanations are not repeated unless necessary.

Referring to FIG. 12, the display apparatus 1000D may include a display substrate 100D, an opposing substrate 200 opposite to the display substrate 100D, a gate driver circuit 300, at least one flexible circuit board 400, at least one data driver circuit 500 and a printed circuit board 600.

The display substrate 100D may include a display area DA and a peripheral area PA surrounding the display area DA.

A plurality of pixels P, a plurality of data lines DL and a plurality of gate lines GL may be disposed in the display area DA. Although not shown in figures, the display substrate 100D may include a first display area DA1 which includes a reflection area in which only reflection electrode is disposed and a second display area DA2 which a reflection area in which the reflection control member is disposed as described in the previous exemplary embodiment referring to FIG. 10.

The pixel P may include a light-emitting area EA in which a light is emitted and a reflection area RA in which a light is reflected. An organic light emitting diode may be disposed in the light-emitting area EA and a pixel circuit part which drives the organic light emitting diode may be disposed in the reflection area RA. The pixel circuit part may include at least one transistor and at least one capacitor and may be connected to at least one data line DL and at least one gate line GL.

The data driver circuit 500 may be mounted on the flexible circuit board 400.

The flexible circuit board 400 may be connected between the display substrate 100D and the printed circuit board 600. For example, the flexible circuit board 400 may include a first end portion connected to the printed circuit board 600 and a second end portion connected to the peripheral area PA of the display substrate 100D.

The data driver circuit 500 may include the same or like parts as those described in the previous exemplary embodiment referring to FIG. 9.

Thus, the data driver circuit 500 may include a data circuit part 510 and a sensor circuit part 530.

The data circuit part 510 may include a sample latch 511, a line latch 513, a data signal convertor 515 and a data output part 517. The sensor circuit part 530 may include a light sensor 531, a sensing amplifier 533, a sensing signal convertor 535 and a control outputting part 537.

For example, when the sensing data corresponding to the intensity of the incident light are lower than reference data, the control outputting part 537 may be configured to provide the reflection electrode and the transparent electrode with first and second driving signals which have same voltage levels as each other to drive the reflection control member with a transparent mode. However, when the sensing data corresponding to the intensity of the incident light are higher than the reference data, the control outputting part 537 may be configured to provide the reflection electrode and the transparent electrode with the first and second driving signals which have different voltage levels to drive the reflection control member with a translucent mode. Therefore, the reflectivity of the reflection area may be controlled based on the intensity of the incident light and thus, a visibility of an image displayed on the display apparatus may be improved.

According to the exemplary embodiment, the data circuit part and the sensor circuit part may be formed as single chip using a TSV (Through Silicon Via) technology and thus a thickness and a size of the data driver circuit may decrease. In addition, the reflection electrode for the mirror may be used as the driving electrode of the reflection control member and thus, a thickness of the display apparatus may decrease.

Figure 13:
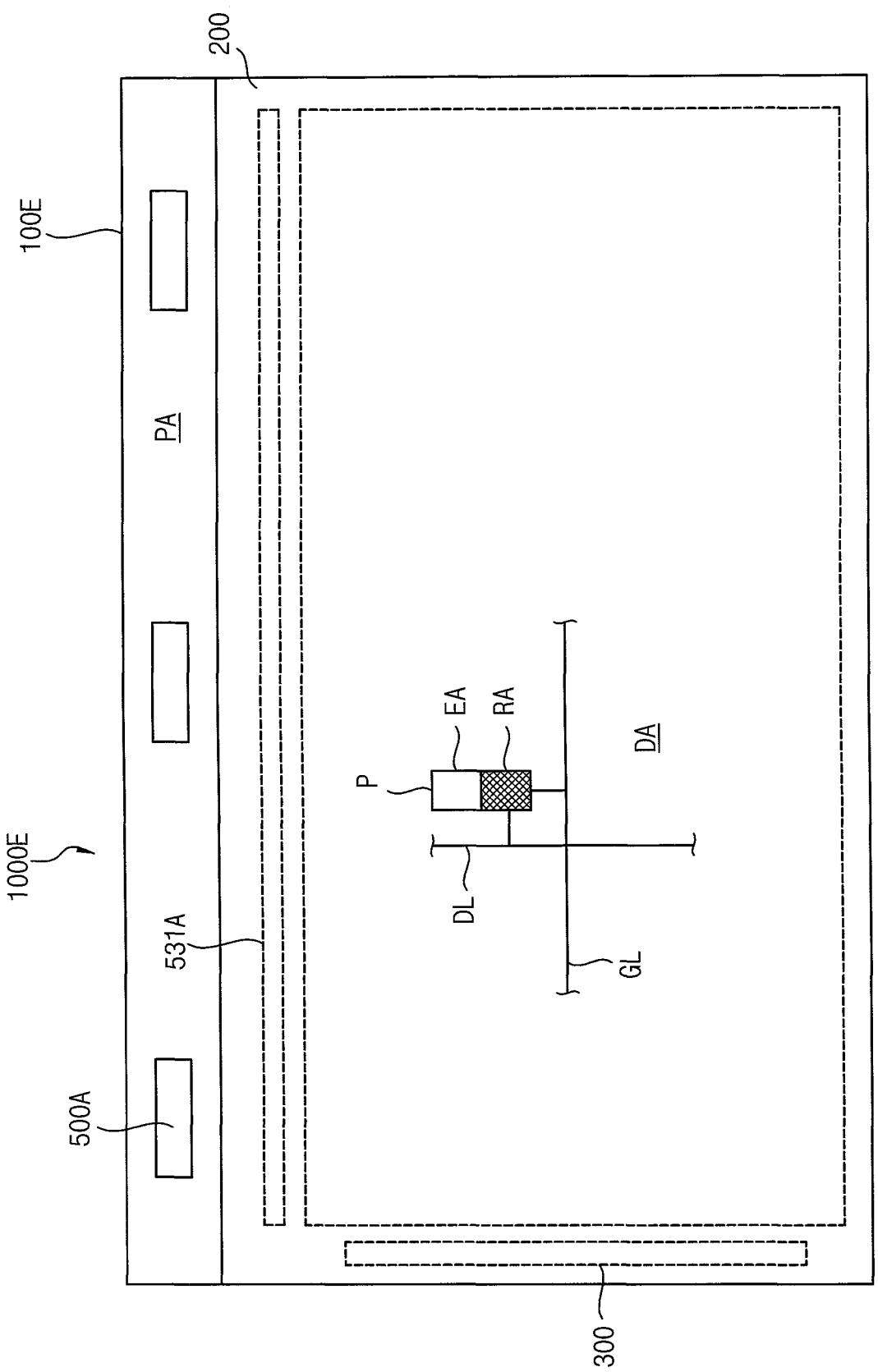
FIG. 13 is a cross-sectional view illustrating a display apparatus according to an exemplary embodiment.
Figure 14:
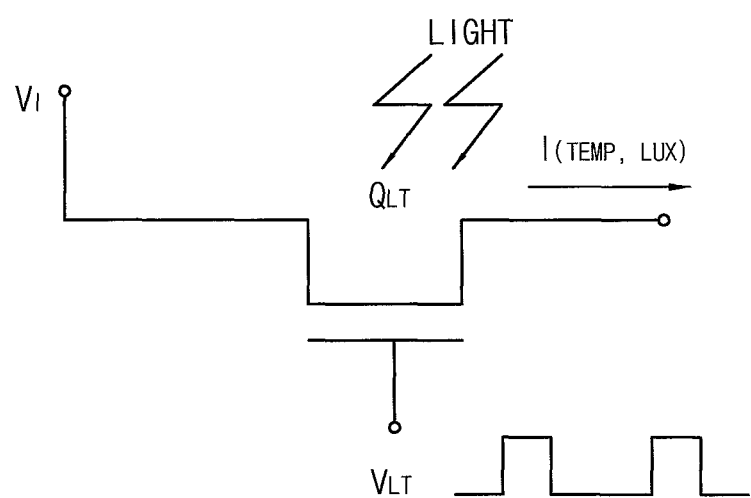
FIG. 14 is a conceptual diagram illustrating a light-sensing part shown in FIG. 13.

FIG. 13 is a cross-sectional view illustrating a display apparatus according to an exemplary embodiment. FIG. 14 is a conceptual diagram illustrating a light-sensing part shown in FIG. 13.

According to the exemplary embodiment, the display apparatus 1000E may include a light sensor 531A which is disposed in peripheral area PA of the display substrate 100E and formed via the process substantially same as that forming the at least one transistor in the pixel circuit part.

Referring to FIGS. 13 and 14, the display apparatus 1000E may include a display substrate 100E, an opposing substrate 200 opposite to the display substrate 100E, a gate driver circuit 300, at least one data driver circuit 500A and a light sensor 531A.

The display substrate 100E may include a display area DA and a peripheral area PA surrounding the display area DA.

A plurality of pixels P, a plurality of data lines DL and a plurality of gate lines GL may be disposed in the display area DA. Although not shown in figures, the display substrate 100E may include a first display area DA1 which includes a reflection area in which only reflection electrode is disposed and a second display area DA2 which a reflection area in which the reflection control member is disposed as described in the previous exemplary embodiment referring to FIG. 10.

The pixel P may include a light-emitting area EA in which a light is emitted and a reflection area RA in which a light is reflected. An organic light emitting diode may be disposed in the light-emitting area EA and a pixel circuit part which drives the organic light emitting diode may be disposed in the reflection area RA. The pixel circuit part may include at least one transistor and at least one capacitor and may be connected to at least one data line DL and at least one gate line GL.

The gate driver circuit 300 may be disposed in the peripheral area PA. The gate driver circuit 300 may be configured to provide at least one transistor in the pixel circuit part with a gate signal. The gate driver circuit 300 may include a plurality of transistors which is formed via the process substantially same as that forming the at least one transistor in the pixel circuit part.

The data driver circuit 500A may be disposed in the peripheral area PA. The data driver circuit 500A may be configured to provide the at least one transistor in the pixel circuit part with a data signal.

In addition, the data driver circuit 500A may be configured to sense the light incident from the external through the light sensor 531A and to generate driving signals to drive the reflection control member in the reflection area RA based on a sensing signal corresponding to an intensity of the incident light.

The data driver circuit 500A may omit the light sensor 531 in the sensor circuit part 530 in comparison with the data driver circuit 500 according to the previous exemplary embodiment referring to FIG. 9.

According to the exemplary embodiment, the light sensor 531A may be disposed in the peripheral area PA of the display substrate 100E and include a plurality of light-sensing elements QLT as shown in FIG. 14.

The plurality of light-sensing elements QLT may be disposed in the peripheral area PA adjacent to the display area DA.

The light-sensing elements QLT may be formed in the peripheral area of the display substrate 100E via the process substantially same as that forming the at least one transistor in the pixel circuit part.

The plurality of light-sensing elements QLT may be configured to turn on in response to a sensing control signal VLT and to output a plurality of sensing signals 531s corresponding to a light-current I Temp, Lux based on an input voltage VI.

Then, referring to FIG. 9, the sensing amplifier 533 may be configured to amplify a level of the sensing signal into a predetermined level and to output a sample sensing signal 533s having the predetermined level. The sensing amplifier 533 may output a plurality of sample sensing signals 533s.

The sensing signal convertor 535 may be configured to convert the sample sensing signal 533s of an analog signal to sensing data 535s of a digital signal. The sensing signal convertor 535 may be configured to output a plurality of sensing data 535s.

The control outputting part 537 may be configured to store the plurality of sensing data 535s at a memory such as a resistor by a predetermined period and to determine an intensity of the incident light based on the plurality of sensing data 535s stored in the memory. For example, the control outputting part 537 may be configured to determine a maximum value of the plurality of sensing data 535s as the intensity of the incident light.

The control outputting part 537 may be configured to output driving signals to drive the reflection control member based on the determined intensity of the incident light.

For example, when the sensing data corresponding to the intensity of the incident light are lower than reference data, the control outputting part 537 may be configured to provide the reflection electrode and the transparent electrode with first and second driving signals which have same voltage levels as each other to drive the reflection control member with a transparent mode. However, when the sensing data corresponding to the intensity of the incident light are higher than the reference data, the control outputting part 537 may be configured to provide the reflection electrode and the transparent electrode with the first and second driving signals which have different voltage levels to drive the reflection control member with a translucent mode. Therefore, the reflectivity of the reflection area may be controlled based on the intensity of the incident light and thus, a visibility of an image displayed on the display apparatus may be improved.

According to the exemplary embodiment, the reflection electrode for the mirror may be used as the driving electrode of the reflection control member and thus, a thickness of the display apparatus may decrease. The data circuit part outputting the data signal applied to the pixel and the sensor circuit part outputting the driving signals applied to the reflection control member may be formed as single chip using a TSV (Through Silicon Via) technology and thus a sixe of the data driver circuit may decrease.

The present inventive concept may be applied to a display device and an electronic device having the display device. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The foregoing is illustrative of the inventive concept and is not to be construed as limiting thereof. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. A display substrate comprising:
an organic light emitting diode disposed in a light-emitting area on a base substrate;
a reflection electrode disposed in a reflection area on the base substrate;
a transparent electrode disposed on the reflection electrode;
a reflection control layer disposed between the reflection electrode and the transparent electrode, and configured to control a reflectivity based on driving signals applied to the reflection electrode and the transparent electrode; and
a pixel defining layer comprising a first opening formed in the light-emitting area corresponding to a first electrode of the organic light emitting diode,
wherein the first opening does not overlap the reflection electrode, the transparent electrode, and the reflection control layer.

2. The display substrate of claim 1, further comprising:
a pixel circuit part disposed under the reflection electrode in the reflection area configured to drive the organic light emitting diode.

3. The display substrate of claim 1, further comprising an encapsulation layer disposed on the organic light emitting diode in the light-emitting area and the reflection area, wherein the reflection electrode is disposed on the encapsulation layer.

4. The display substrate of claim 1, further comprising:
a planarization layer comprising a via-hole through which the first electrode of the organic light emitting diode is connected to the pixel circuit part,
wherein the pixel defining layer further comprises a second opening formed in the reflection area.

5. The display substrate of claim 4, wherein the pixel defining layer comprises a light shielding material.

6. The display substrate of claim 4, wherein a light-emitting layer and a second electrode of the organic light emitting diode are stacked in the first opening of the light-emitting area, and the second electrode of the organic light emitting diode is disposed in the second opening of the reflection area.

7. The display substrate of claim 4, wherein a light-emitting layer and a second electrode of the organic light emitting diode are stacked in the first opening of the light-emitting area and the second opening of the reflection area, respectively.

8. A display apparatus comprising:
a display panel comprising a display area in which a plurality of pixels is arranged and a peripheral area surrounding the display area, each of the plurality of pixels comprising a light-emitting area in which an organic light emitting diode is disposed and a reflection area in which a reflection electrode, a transparent electrode and a reflection control layer between the reflection electrode and the transparent electrode are disposed; and
a data driver circuit configured to output a data signal to drive the organic light emitting diode and driving signals to drive the reflection electrode and the transparent electrode based on an intensity of an incident light,
wherein the display panel further comprises a pixel defining layer comprising a first opening formed on the light-emitting area corresponding to a first electrode of the organic light emitting diode, and
wherein the first opening does not overlap the reflection electrode, the transparent electrode, and the reflection control layer.

9. The display substrate of claim 8, wherein the display panel further comprises a pixel circuit part disposed under the reflection electrode configured to drive the organic light emitting diode.

10. The display substrate of claim 8, wherein the display panel further comprises an encapsulation layer disposed in the light-emitting area in which the organic light emitting diode is disposed and the reflection area, wherein the reflection electrode is disposed on the encapsulation layer in the reflection area.

11. The display substrate of claim 8, wherein the display panel further comprises a planarization layer comprising a via-hole through which the first electrode of the organic light emitting diode is connected to the pixel circuit part, and the pixel defining layer further comprises a second opening formed on the reflection area.

12. The display substrate of claim 11, wherein a light-emitting layer and a second electrode of the organic light emitting diode are stacked in the first opening of the light-emitting area and at least one of the light-emitting layer and the second electrode of the organic light emitting diode is disposed in the second opening of the reflection area.

13. The display substrate of claim 11, wherein the pixel defining layer comprises a light shielding material.

14. The display substrate of claim 11, wherein the reflection control layer and the transparent electrode are selectively disposed in a partial area of the display area.

15. The display substrate of claim 8, wherein when the intensity of the incident light is normal, the data driver circuit is configured to provide the reflection electrode and the transparent electrode with a first driving signal and a second driving signal equal to the first driving signal, respectively, and when the intensity of the incident light is abnormal, the data driver circuit is configured to provide the reflection electrode and the transparent electrode with a first driving signal and a second driving signal different from the first driving signal, respectively.

16. The display substrate of claim 8, wherein the data driver circuit comprises:
   a data driving part configured to output the data signal;
   a light-sensing part configured to sense the incident light and output a sensing signal; and
   a control output part configured to output the first and second driving signals based on the sensing signal.

17. The display substrate of claim 8, wherein the data driver circuit is disposed in the peripheral area of the display panel.

18. The display substrate of claim 8, wherein the data driver circuit is disposed on a flexible circuit board, wherein an end portion of the flexible circuit board is disposed on the peripheral area of the display panel.

19. The display substrate of claim 8, wherein the display panel further comprises a plurality of light-sensing elements arranged in the peripheral area and configured to sense a light to output a sensing signal.

20. The display substrate of claim 8, wherein the data driver circuit comprises a data driving part configured to output the data signal; and
   a control output part configured to output the first and second driving signals based on the sensing signal.

* * * * *